United States Patent
Camillo-Castillo et al.

(10) Patent No.: US 9,368,608 B1
(45) Date of Patent: Jun. 14, 2016

(54) HETEROJUNCTION BIPOLAR TRANSISTOR WITH IMPROVED PERFORMANCE AND BREAKDOWN VOLTAGE

(71) Applicant: GLOBALFOUNDARIES INC., Grand Cayman, KY (US)

(72) Inventors: Renata Camillo-Castillo, Essex Junction, VT (US); Vibhor Jain, Essex Junction, VT (US); Vikas K. Kaushal, Essex Junction, VT (US); Marwan H. Khater, Astoria, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/749,809

(22) Filed: Jun. 25, 2015

(51) Int. Cl.
| | |
|---|---|
| *H01L 29/732* | (2006.01) |
| *H01L 29/66* | (2006.01) |
| *H01L 29/06* | (2006.01) |
| *H01L 29/737* | (2006.01) |
| *H01L 21/764* | (2006.01) |
| *H01L 21/265* | (2006.01) |
| *H01L 29/08* | (2006.01) |

(52) U.S. Cl.
CPC ...... *H01L 29/7371* (2013.01); *H01L 21/26586* (2013.01); *H01L 21/764* (2013.01); *H01L 29/0649* (2013.01); *H01L 29/0821* (2013.01); *H01L 29/66242* (2013.01); *H01L 29/66272* (2013.01); *H01L 29/66287* (2013.01); *H01L 29/732* (2013.01); *H01L 29/0653* (2013.01)

(58) Field of Classification Search
CPC ............ H01L 29/0649; H01L 29/66272; H01L 29/7322; H01L 29/0821; H01L 29/73; H01L 21/28518; H01L 29/7378; H01L 29/732
USPC ............... 257/197, 586; 438/319, 359
See application file for complete search history.

(56) References Cited

U.S. PATENT DOCUMENTS

| | | | |
|---|---|---|---|
| 5,789,301 | A | 8/1998 | Hill |
| 6,864,560 | B2 | 3/2005 | Khater et al. |
| 6,940,149 | B1 | 9/2005 | Divakaruni et al. |
| 6,964,907 | B1 | 11/2005 | Hopper et al. |
| 7,190,046 | B2 | 3/2007 | Akatsu et al. |
| 7,342,293 | B2 | 3/2008 | Wallner et al. |
| 7,462,547 | B2 | 12/2008 | Akatsu et al. |
| 7,816,221 | B2 | 10/2010 | John et al. |

(Continued)

OTHER PUBLICATIONS

Johnson, F.S. et al., "Selective Chemical Etching of Polycrystalline SiGe Alloys with Respect to Si and SiO2," Journal of Electronic Materials, vol. 21, No. 8, 1992, pp. 805-810.

(Continued)

*Primary Examiner* — Evan Pert
*Assistant Examiner* — Changhyun Yi
(74) *Attorney, Agent, or Firm* — Thompson Hine LLP; Anthony J. Canale (57) ABSTRACT

Fabrication methods for a device structure and device structures. A trench isolation region is formed that bounds an active device region of a semiconductor substrate. A first semiconductor layer is formed on the active device region and on the trench isolation region. A first airgap is formed between the first semiconductor layer and the active device region. A second airgap is formed between the first semiconductor layer and the trench isolation region. The first airgap extends into the active device region such that the height of the first airgap is greater than the height of the second airgap.

20 Claims, 11 Drawing Sheets

(56) References Cited

U.S. PATENT DOCUMENTS

| | | |
|---|---|---|
| 8,067,290 B2 | 11/2011 | Boeck et al. |
| 8,409,959 B2 | 4/2013 | El-Kareh et al. |
| 8,927,381 B2 | 1/2015 | Harame et al. |
| 2010/0187657 A1* | 7/2010 | Boeck ................ H01L 29/0649 257/593 |
| 2014/0231877 A1 | 8/2014 | Adkisson et al. |
| 2014/0327111 A1 | 11/2014 | Camillo-Castillo et al. |

OTHER PUBLICATIONS

Loubet, N. et al., "Selective etching of Si1-xGex versus Si with gaseous HCl for the formation of advanced CMOS devices," Thin Solid Films, 517, 2008, pp. 93-97.

Washio, K. et al., "A 0.2-µm 180-GHz-fmax 6.7-ps-ECL SOI/HRS Self-Aligned SEG SiGe HBT/CMOS Technology for Microwave and High-Speed Digital Applications," IEEE Transactions on Electron Devices, vol. 49, No. 2, pp. 271-278 (Feb. 2002).

* cited by examiner

HETEROJUNCTION BIPOLAR TRANSISTOR WITH IMPROVED PERFORMANCE AND BREAKDOWN VOLTAGE

BACKGROUND

The invention relates generally to semiconductor device fabrication and, in particular, to heterojunction bipolar transistors and fabrication methods for a heterojunction bipolar transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base is situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased, the base-collector junction is reverse biased, and the collector-emitter current may be controlled by the base-emitter voltage.

Device structures and fabrication methods are needed that improve the performance of a bipolar junction transistor.

SUMMARY

In an embodiment of the invention, a method is provided for forming a device structure. A trench isolation region is formed that bounds an active device region of a semiconductor substrate. A first semiconductor layer is formed on the active device region and on the trench isolation region. A first airgap is formed between the first semiconductor layer and the active device region. A second airgap is formed between the first semiconductor layer and the trench isolation region. The first airgap extends into the active device region such that the height of the first airgap is greater than the height of the second airgap.

In an embodiment of the invention, a device structure includes a trench isolation region in a semiconductor substrate, and an active device region bounded by the trench isolation region. The active device region is comprised of a portion of the semiconductor substrate. The device structure further includes a first semiconductor layer overlying the active device region and on the trench isolation region, a first airgap between the first semiconductor layer and the active device region, and a second airgap between the first semiconductor layer and the trench isolation region. The first airgap extends into the active device region such that the height of the first airgap is greater than the height of the second airgap.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
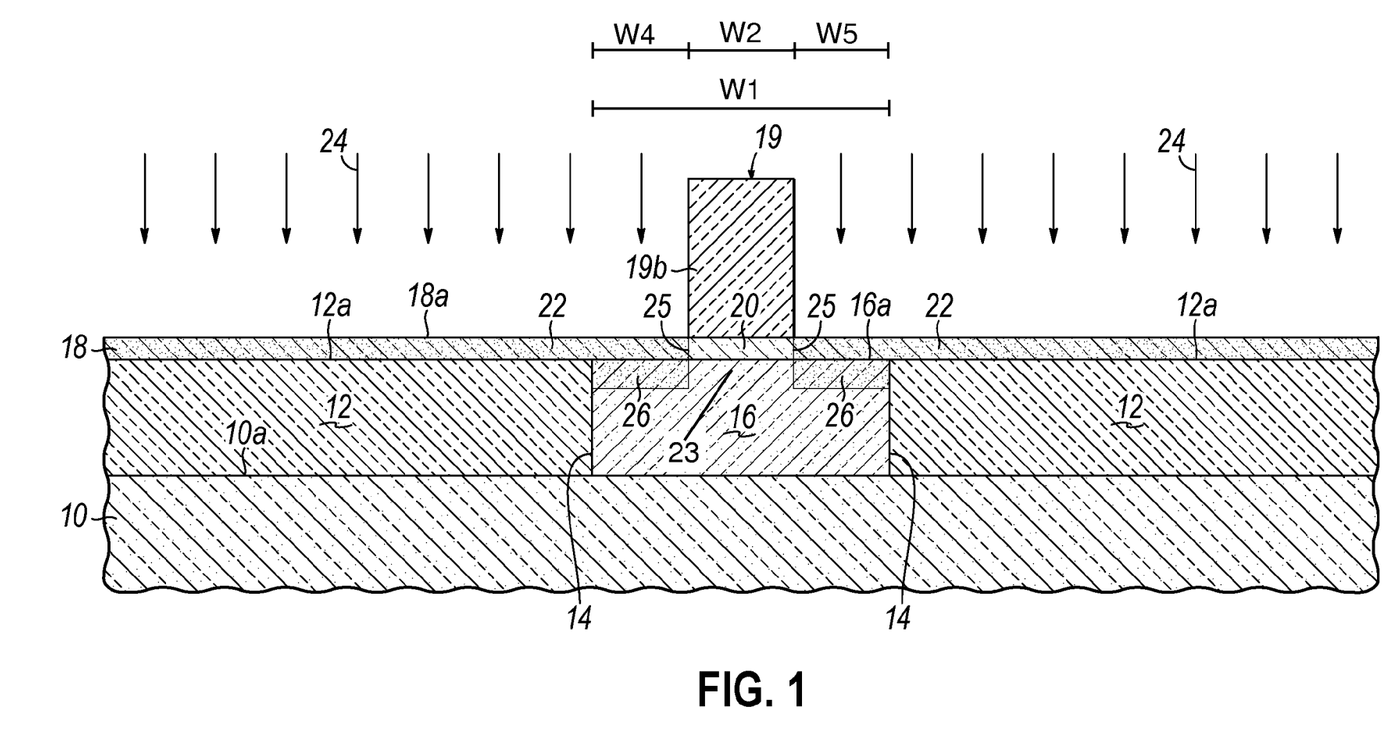
FIGS. 1-6 are cross-sectional views of a portion of a substrate at successive fabrication stages of a processing method for fabricating a device structure in accordance with an embodiment of the invention.
Figure 1A:
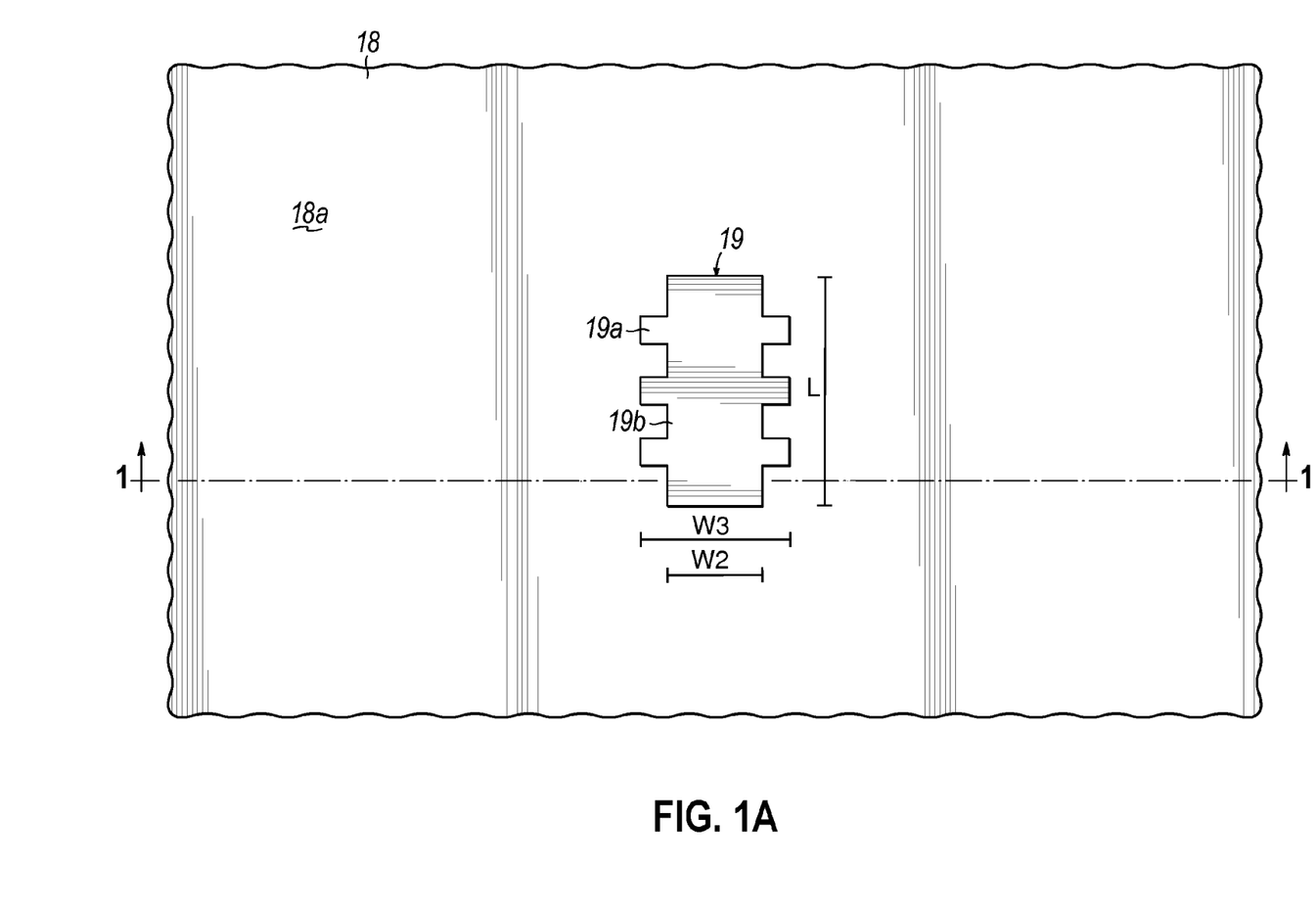
FIG. 1A is a top view of an implantation mask used in the fabrication state of FIG.

With reference to FIGS. 1, 1A and in accordance with an embodiment of the invention, a substrate 10 comprises a single-crystal semiconductor material usable to form the devices of an integrated circuit. The semiconductor material constituting the substrate 10 may include an epitaxial layer at its surface, which may contain an electrically-active dopant that alters its electrical properties. For example, the substrate 10 may include an epitaxial layer of single crystal silicon that is epitaxially deposited or grown by chemical vapor deposition (CVD) and that is doped with a concentration of an n-type dopant from Group V of the Periodic Table (e.g., phosphorus (P), arsenic (As), or antimony (Sb)) in a concentration that is effective to impart n-type conductivity. Alternatively, the epitaxial layer may be grown without doping and then all or part of it doped at a subsequent stage of the processing method by ion implantation.

Trench isolation regions 12 include sidewalls 14 that circumscribe and are coextensive with an active device region 16. The active device region 16 has a width W1 between adjacent sidewalls 14, and is comprised of a portion of the semiconductor material of the substrate 10. The trench isolation regions 12 may be formed by a shallow trench isolation (STI) technique that relies on a lithography and dry etching process to define trenches in substrate 10, deposits an electrical insulator to fill the trenches, and planarizes the electrical insulator relative to the top surface 10a of the substrate 10 using a chemical mechanical polishing (CMP) process. The electrical insulator may be comprised of an oxide of silicon, such as tetraethylorthosilicate (TEOS) deposited by chemical vapor deposition (CVD). The collector 16 may comprise, for example, semiconductor material from the epitaxial layer.

The top surface 10a of substrate 10 may be cleaned to, for example, remove native oxide. The cleaning process may be a wet chemical etching process using either dilute hydrofluoric (DHF) or buffered hydrofluoric (BHF), or a dry process, such as chemical oxide removal (COR).

A semiconductor layer 18 is deposited on a top surface 16a of the active device region 16 and on a top surface 12a of the trench isolation regions 12. Prior to deposition, the top surface 16a may be cleaned to, for example, remove native oxide. The semiconductor layer 18 may be comprised of a non-single crystal semiconductor material, such as polycrystalline semiconductor material or amorphous semiconductor material. In one embodiment, the semiconductor layer 18 may be comprised of polycrystalline silicon (polysilicon) deposited using rapid thermal chemical vapor deposition (RTCVD) and silane ($SiH_4$) as a source gas. In another embodiment, the semiconductor layer 18 may be comprised of amorphous silicon deposited using plasma-enhanced chemical vapor deposition (PECVD) or low-pressure chemical vapor deposition (LPCVD).

A patterned mask 19 is formed on a top surface 18a of semiconductor layer 18 and covers a section 20 of semiconductor layer 18. The mask 19 may be comprised of a sacrificial layer that is applied and photolithographically patterned. To that end, the layer may be comprised of a photoresist that is applied by a spin coating process, pre-baked, exposed to a radiation projected through a photomask, baked after exposure, and developed with a chemical developer to form the patterned mask 19.

Energetic ions, as indicated diagrammatically by the single-headed arrows 24, are introduced using ion implantation into sections 22 of semiconductor layer 18 that are not masked by mask 19. The mask 19 operates as an ion-implantation mask that protects the masked section 20 and the section of the collector 16 beneath the masked section 20 against receiving an implanted dose of the ions 24. The masked section 20 and the unmasked section 22 join along edges 25 that are vertically aligned with edges of the mask 19. Doped regions 26 are formed in the active device region 16 by the ion implantation adjacent to the masked section 20 of the semiconductor layer 18. The implantation conditions may be selected to tune the implanted depth so that an entire thickness of the unmasked sections 22 is implanted and the doped regions 26 are formed in the active device region 16. In particular, the implantation conditions (e.g., ion energy and dose) are selected to form the doped regions 26 with a desired depth profile and doping concentration at a shallow depth beneath the top surface 16a of the active device region 16.

In one embodiment, the ions 24 may be positive ions of germanium (Ge) implanted at a low energy, and the germanium concentration of section 22 and doped regions 26 may be greater than or equal to one (1) atomic percent. The shape and depth of the doped regions 26 can be controlled by changing the implant angle and/or by using chain implants (e.g., multiple implantations at different energies). As used herein, the term "angled implantation" denotes that the ion trajectories impinge the top surface traveling at incident angles that than 0°, wherein 0° represents a direction normal (i.e., perpendicular) to the top surface 16a of the semiconductor layer 18. The ions 24 also introduce implantation damage to the crystal structure of the doped regions 26.

Following the ion implantation, the composition of the unmasked sections 22 differs from the composition of the masked section 20 and the composition of the doped regions 26 differs from the composition of the adjacent and underlying semiconductor material of the active device region 16. The doped regions 26 are bounded from below by the semiconductor material of the active device region 16 and the trench isolation regions 12 and are bounded from above by the semiconductor layer 18. The composition difference promotes an etch rate difference, as discussed below, between the masked section 20 of semiconductor layer 18 and the unmasked sections 22 of semiconductor layer 18, as well as between the doped regions 26 and the undoped remainder of the active device region 16. An undoped region 23 of the active device region 16 is located laterally between the doped regions 26, and extends vertically over the same range of depths beneath top surface 12a as the doped regions 26.

The mask 19 can be provided with multiple different widths and/or shapes in order to eventually define targeted widths and/or shapes for a collector formed from the active device region 16. In the representative embodiment, the mask 19 includes a series of wide sections 19a with width W3 and narrow sections 19b with width W2 that are narrow than the wide sections 19a. In an alternative embodiment, one or more of the wide sections 19a may reach to the sidewalls 14 of the trench isolation regions 12 so that a gap is absent. The number, shape, and dimensions of the wide sections 19a and narrow sections 19b may vary depending on a device design.

The masked section 20 of semiconductor layer 18 will include wide and narrow portions that replicate the overlying wide sections 19a and narrow sections 19b of the mask 19. The masked section 20 of semiconductor layer 18 will lack the altered composition produced by the ion implantation and, instead will reflect the composition of the originally-deposited semiconductor layer 18. The masked section 20 will have narrow portions with a width given by width W2 of the narrow sections 19b of mask 19 and wide portions with a width given by width W3 of the wide sections 19a of mask 19.

The doped regions 26 have widths W4, W5 that vary along the length of the subsequently-formed emitter in relation to the widths of the sections 19a, 19b of the mask 19. The widths W4, W5 of the doped regions 26 at locations adjacent to the narrow sections 19b of mask 19 will be greater than the widths W4, W5 of the doped regions 26 at locations adjacent to the wide sections 19a of mask 19. The sum of the widths W2, W4, W5 at the location of the narrow sections 19b may be equal to the width W1 of the active device region 16. The sum of the widths W3, W4, W5 at the location of the wide sections 19a may also be equal to the width W1 of the active device region 16.

Figure 2:
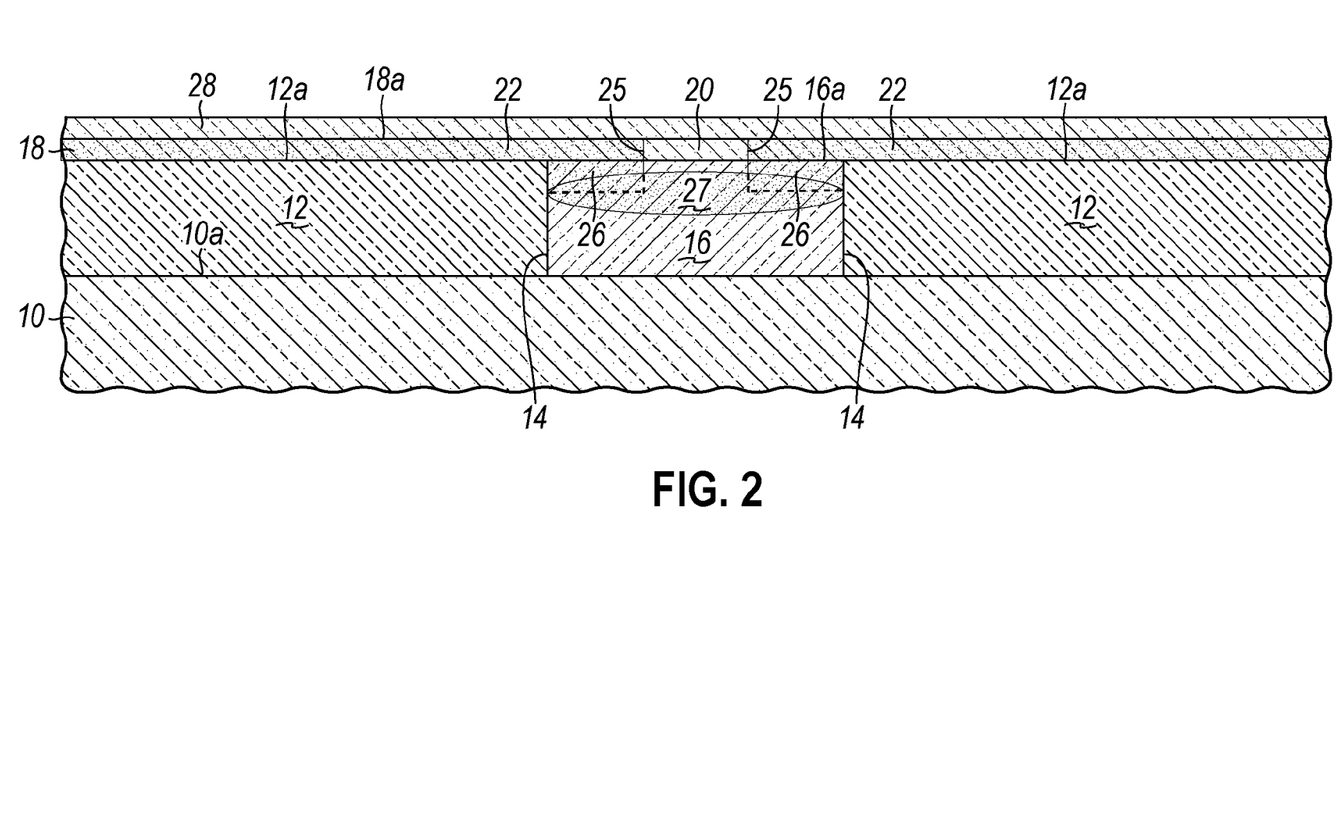

With reference to FIG. 2 in which like reference numerals refer to like features in FIG. 1 and at a subsequent fabrication stage of the processing method, the mask 19 is removed after the section 22 of altered composition is defined. If comprised of a photoresist, the mask 19 may be removed by ashing or solvent stripping, followed by surface cleaning A collector region 27 may be formed in the active device region 16. To that end, the active device region 16 may be selectively ion implanted to introduce a concentration of an n-type dopant from Group V of the Periodic Table (e.g., phosphorus (P), arsenic (As), or antimony (Sb)) in a concentration that is effective to impart n-type conductivity. The collector region 27 is characterized by an elevated concentration of the n-type dopant that is greater than the n-type dopant concentration in the remainder of the semiconductor material between the sidewalls 14 of the trench isolation regions 12. The semiconductor layer 18 functions to reduce the range of the ions such that the collector region 27 is closer to the top surface 18a than in the absence of the semiconductor layer 18.

A semiconductor layer 28 is formed on the top surface 18a of semiconductor layer 18 and directly contacts the sections 20, 22 of the semiconductor layer 18. The semiconductor layer 28 may be comprised of a non-single crystal semiconductor material, such as polycrystalline semiconductor material or amorphous semiconductor material. In an embodiment, the semiconductor layer 28 may be comprised of polysilicon deposited using rapid thermal chemical vapor deposition, or amorphous silicon deposited using plasma-enhanced chemical vapor deposition or low-pressure chemical vapor deposition.

Figure 3:
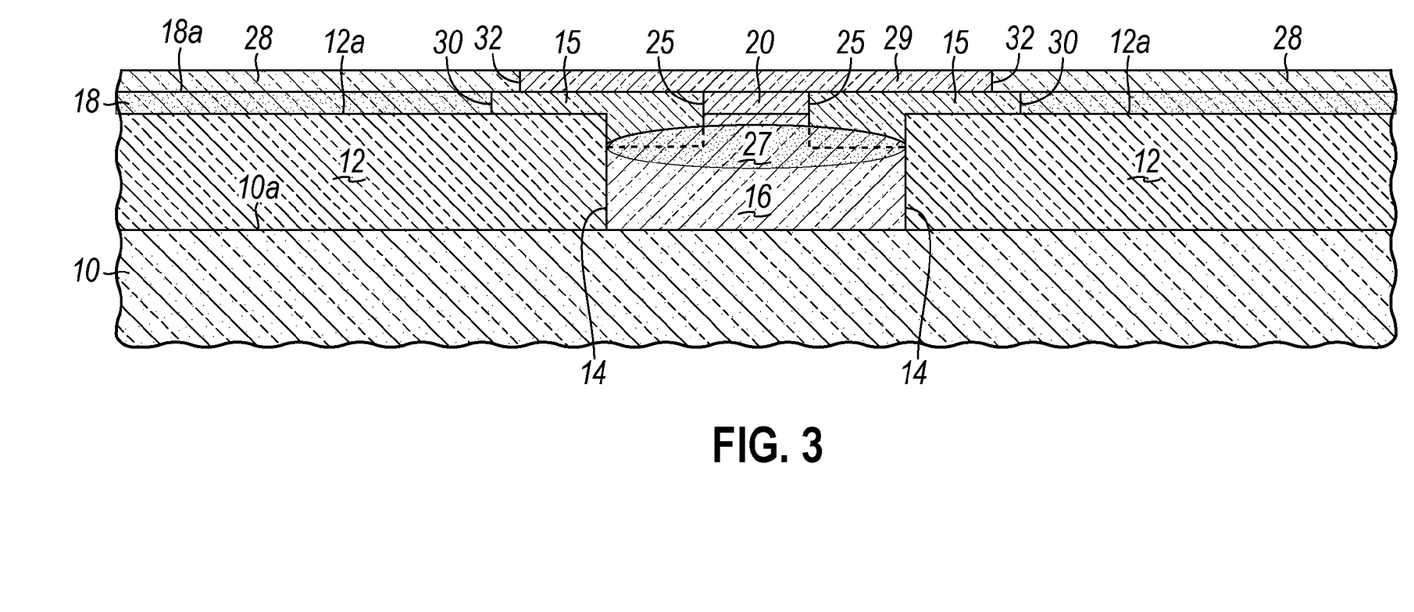

With reference to FIG. 3 in which like reference numerals refer to like features in FIG. 2 and at a subsequent fabrication stage of the processing method, one or more thermal anneals are used to laterally realign, e.g., regrow or crystallize, the material of semiconductor layer 28 and the material of semiconductor layer 18, including the non-implanted section 20 and implanted sections 22, as well as the implanted doped regions 26 in the active device region 16. The doped regions 26 and semiconductor layer 18 have an epitaxial relationship with the single crystal semiconductor material of the active device region 16 and the semiconductor layer 28 has an epitaxial relationship with the regrown single-crystal semiconductor material of semiconductor layer 18. In the alignment process, the semiconductor layer 18 acquires the crystal structure and orientation of the single crystal semiconductor material of the active device region 16 (e.g., the substrate 10). To that end, the single crystal material of the active device region 16 operates as a growth seed for crystalline realignment of the non-single crystal material of the semiconductor layer 18 and crystalline realignment of the non-single crystal material of the doped regions 26. Similarly, in the alignment process, the semiconductor layer 28 acquires the crystal structure and orientation of the single crystal material of the semiconductor layer 18. The single crystal material of the semiconductor layer 18 operates as a growth seed for crystalline realignment of the non-single crystal material of semiconductor layer 28.

The conditions (e.g., time and temperature) for the thermal anneal are selected to control the recrystallization and the extent of the lateral regrowth of the semiconductor layers 18, 28, as well as to completely regrow the doped regions 26. The regrown material of the semiconductor layer 18 and the doped regions 26 defines a section 15 that is in a crystalline state. The material of semiconductor layer 18 transitions from section 15 to a section in a non-single crystal state (e.g., polycrystalline) at an edge 30. Similarly, the material of semiconductor layer 28 transitions from section 29 to a section in a non-single crystal state (e.g., polycrystalline or amorphous) at an edge 32. The edges 30, 32 are located vertically outside of the sidewalls 14 of the trench isolation regions 12 and overlie the trench isolation regions 12. The lateral regrowth rates may differ such that the edges 30, 32 are not vertically aligned. Representative thermal annealing conditions include, as examples, a two-hour anneal at 600° C. or a fifteen-minute anneal at 900° C. with higher temperatures requiring less time to provide the same lateral extent of realignment. The dimensions of the single crystal sections 22, 29 in a plane normal to the thickness of semiconductor layers 18, 28 can be adjusted through adjustments to the annealing conditions employed during regrowth and realignment.

Figure 4:
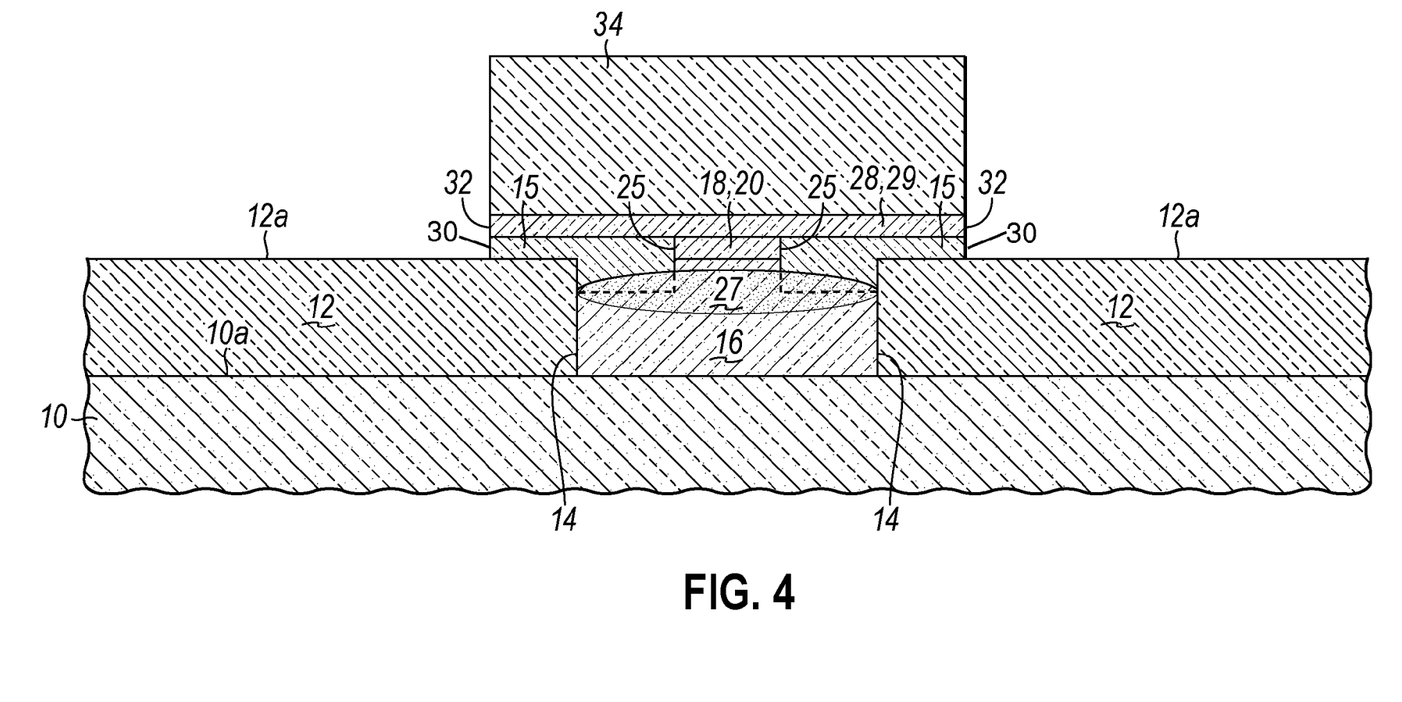

With reference to FIG. 4 in which like reference numerals refer to like features in FIG. 3 and at a subsequent fabrication stage of the processing method, a patterned mask 34 is formed on a top surface of semiconductor layer 28 and is used to open the realigned sections 15, 29. The outer edges of the mask 34 are located inside the edges 30, 32 so that the sections 15, 29 are at least partially covered, and are also located over the trench isolation regions 12 and outside of the sidewalls 14 of trench isolation regions 12. The mask 34 may be comprised of a sacrificial layer that is applied and photolithographically patterned. To that end, the sacrificial layer may be comprised of a photoresist that is applied by spin coating, pre-baked, exposed to a radiation projected through a photomask, baked after exposure, and developed with a chemical developer to form the mask 34. A dry etch process, such as a reactive ion etch (RIE), may be used to remove portions of semiconductor layers 18, 28 that are not covered and protected by the mask 34. All or part of the section 15 of semiconductor layer 18 and all or part of the section 29 of semiconductor layer 28 are covered by the mask 34 and remain intact following the etch process that removes the unprotected sections of these layers 18, 28. The edges 30, 32 are vertically located over the trench isolation regions 12 and their top surface 12a, and are not located over the active device region 16.

Figure 5:
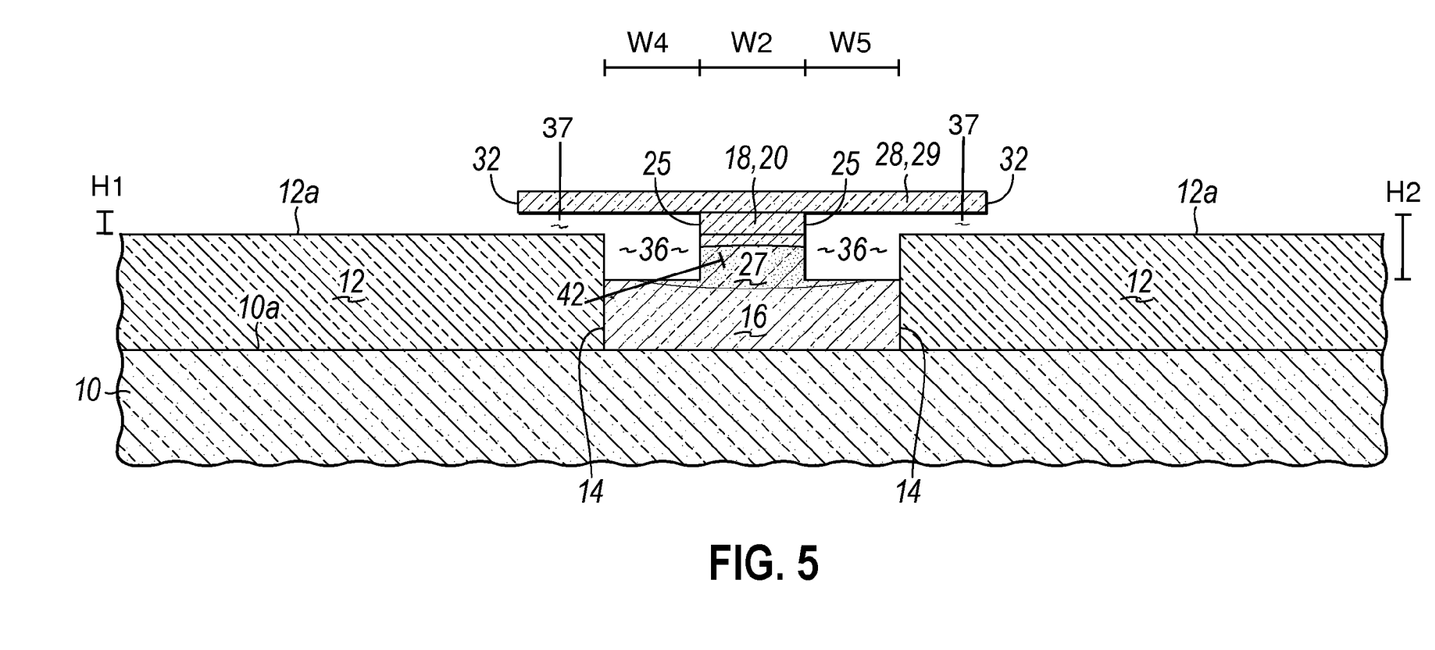
Figure 5A:
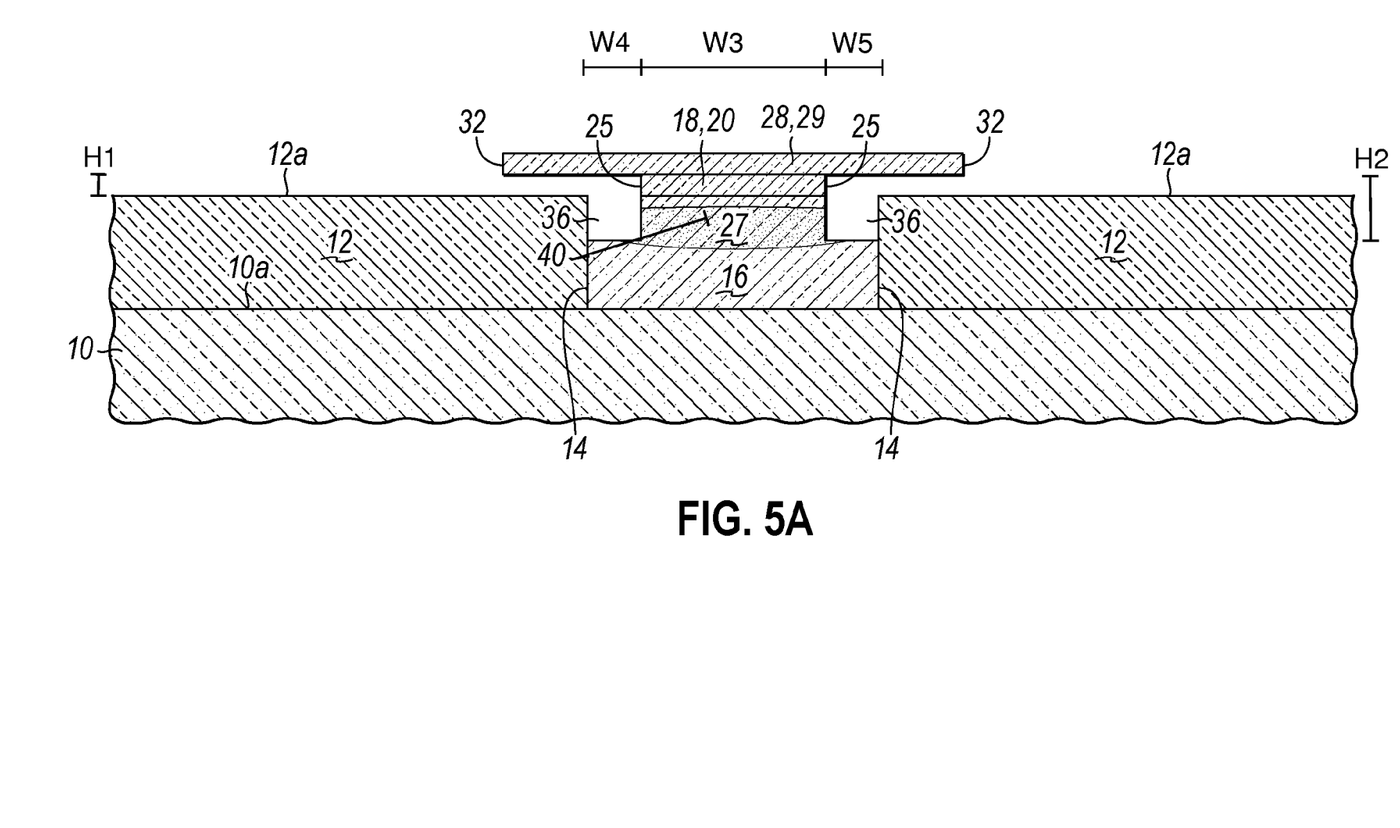
FIG. 5A is a cross-sectional view of the device structure of FIG. 5 taken at a different location along the length of the subsequently-formed emitter.

With reference to FIGS. 5, 5A in which like reference numerals refer to like features in FIG. 4 and at a subsequent fabrication stage of the processing method, the mask 34 is removed. If comprised of a photoresist, the mask 34 may be removed by ashing or solvent stripping, followed by surface cleaning.

An etching process, such as a wet chemical etch, may be utilized to remove the material of the implanted section 22 of the semiconductor layer 18 and the doped regions 26 in the collector 16 selective to the semiconductor material of the section 29 of semiconductor layer 28 and the semiconductor material of the section 20 of semiconductor layer 18. The concentration of the element (e.g., germanium) introduced into the implanted section 22 of semiconductor layer 18 and the doped regions 26 is effective to provide the etch rate selectivity (i.e., the higher etch rate) relative to the sections 20, 29. The etching process is also selective to the material of the trench isolation regions 12. If the implanted section 22 of semiconductor layer 18 and the doped regions 26 in collector 16 are comprised of silicon-germanium and the semiconductor materials of the section 29 of semiconductor layer 28 and the section 20 of semiconductor layer 18 are comprised of silicon, an etchant chemistry that may be used in the etching process is an aqueous solution containing ammonium hydroxide and hydrogen peroxide ($NH_4OH:H_2O_2:H_2O$).

An airgap 37 is produced by the wet chemical etching process as a cavity that undercuts the realigned section 29 of semiconductor layer 28 over the trench isolation regions 12. Airgap 37 is formed when implanted section 22 of the semiconductor layer 18 over the trench isolation region 12 is removed and is located over the trench isolation region 12. Due to the etch selectivity between sections 22 of the semiconductor layer 18 and the doped regions 26 in the collector 16, the airgap 37 extends into and narrows the width of the collector 16 and the collector region 27. Due to the etch selectivity between section 20 and section 22 of the semiconductor layer 18, the airgap 37 terminates at the opposite edges 25 of the section 20 of semiconductor layer 18. The airgap 37 is coextensive with the trench isolation regions 12 and the section 29 of the semiconductor layer 28.

An airgap 36, which is contiguous with airgap 37, is produced by the wet chemical etching process as a cavity that undercuts the realigned section 29 of semiconductor layer 28 over the collector 16 (i.e., the active device region of the substrate 10 surrounded by the trench isolation regions 12). The airgap 36 is formed when the implanted section 22 of the semiconductor layer 18 over the collector 16 and the underlying doped regions 26 in the collector 16 are removed, and is located over the collector 16. The airgap 36 is coextensive with the active device region 16, the section 20 of the semiconductor layer 18, and the section 29 of the semiconductor layer 28.

Airgaps 36, 37 may be characterized by an effective permittivity or dielectric constant of near unity (vacuum permittivity). Airgaps 36, 37 may be filled by air at or near atmospheric pressure, may be filled by another gas at or near atmospheric pressure, or may contain air or another gas at a sub-atmospheric pressure (e.g., a partial vacuum). The extent of the undercut beneath the semiconductor layer 28 and dimensions (i.e., the length and width) of airgaps 36, 37 are determined by the relative locations of the edges 25, 32. The height H1 of airgap 37 between the semiconductor layer 28 and the top surface 12a of the trench isolation regions 12 is determined by the thickness of the semiconductor layer 18. Due to the formation and regrowth of the doped regions 26, the height of airgap 36 is greater than the height of airgap 37. Airgap 36 has a height H2 determined by the thickness of the semiconductor layer 18 and the depth of the doped regions 26 such that the height H2 of airgap 36 is greater than the height H1 of the airgap 37. Airgap 36 extends vertically below the top surface 12a of the trench isolation regions 12 and into the collector 16 and collector region 27 to provide the larger height in comparison with airgap 37.

Airgap 36 has a shape and dimensions that reflect the shape and dimensions of the mask 19 and its sections 19a, 19b. Airgap 36 includes a series of wide sections (FIG. 5) with widths W4, W5 that reflect the removal of the doped semiconductor layer 18 and underlying doped regions 26 implanted adjacent to the narrow sections 19b of mask 19 having width W2. Airgap 36 includes a series of narrow sections (FIG. 5A) with widths W4, W5 less than the widths W4, W5 of its wide sections, and that reflect the removal of the doped semiconductor layer 18 and underlying doped regions 26 implanted adjacent to the wide sections 19a of mask 19 having width W3. The active device region 16 and collector region 27, conversely, are characterized by narrow sections that coincide with the locations of the wide sections of airgap 36 and narrow sections 19b of mask 19 having width W2, and wide sections that coincide with the locations of the narrower sections of airgap 36 and the wider sections 19a of mask 19 having width W3. The wide sections of the airgap 36 are located laterally between the trench isolation regions 12 and the narrow sections of the active device region 16 and collector region 27 (which may have a width equal to width W2). The narrow sections of the airgap 36 are located laterally between the trench isolation regions 12 and the wide sections of the active device region 16 and collector region 27 (which may have a width equal to width W3).

The collector of the device structure comprises the collector region 27 and may further include additional semiconductor material from the active device region 16. The size and shape of the collector can be tuned through the characteristics of the mask 19 in order to optimize the collector-to-base parasitic capacitance (Ccb) and the collector resistance (Rc) for improving device efficiency. Generally, the shape and size of the active device region 16 and collector region 27 in the active device region 16 are at least partially defined by the airgap 36. The active device region 16 and collector region 27 in the active device region 16 have wide pedestal sections 40 (FIG. 5A) and narrow pedestal sections 42 (FIG. 5) that are narrow in comparison with the wide pedestal sections 40 as the dimensions of the airgap 37 varies with position. The wide pedestal sections 40 and narrow pedestal sections 42 respectively reflect and acquire a shape reflecting the wide sections 19a and narrow sections 19b of the mask 19 that is in place when the ions 24 are implanted (FIG. 1). The shape and size of the active device region 16 and collector region 27 in the active device region 16 can be tailored by altering the implant conditions (e.g., energy, angle) and can be made smaller than the lithography limits. In particular, the shape and size of the active device region 16, collector region 27 in the active device region 16, and the airgap 36 can be tailored in a direction parallel to the length L (FIG. 1) of the subsequently-formed emitter using the variations in mask 19 and may be tailored to optimize device performance.

Figure 6:
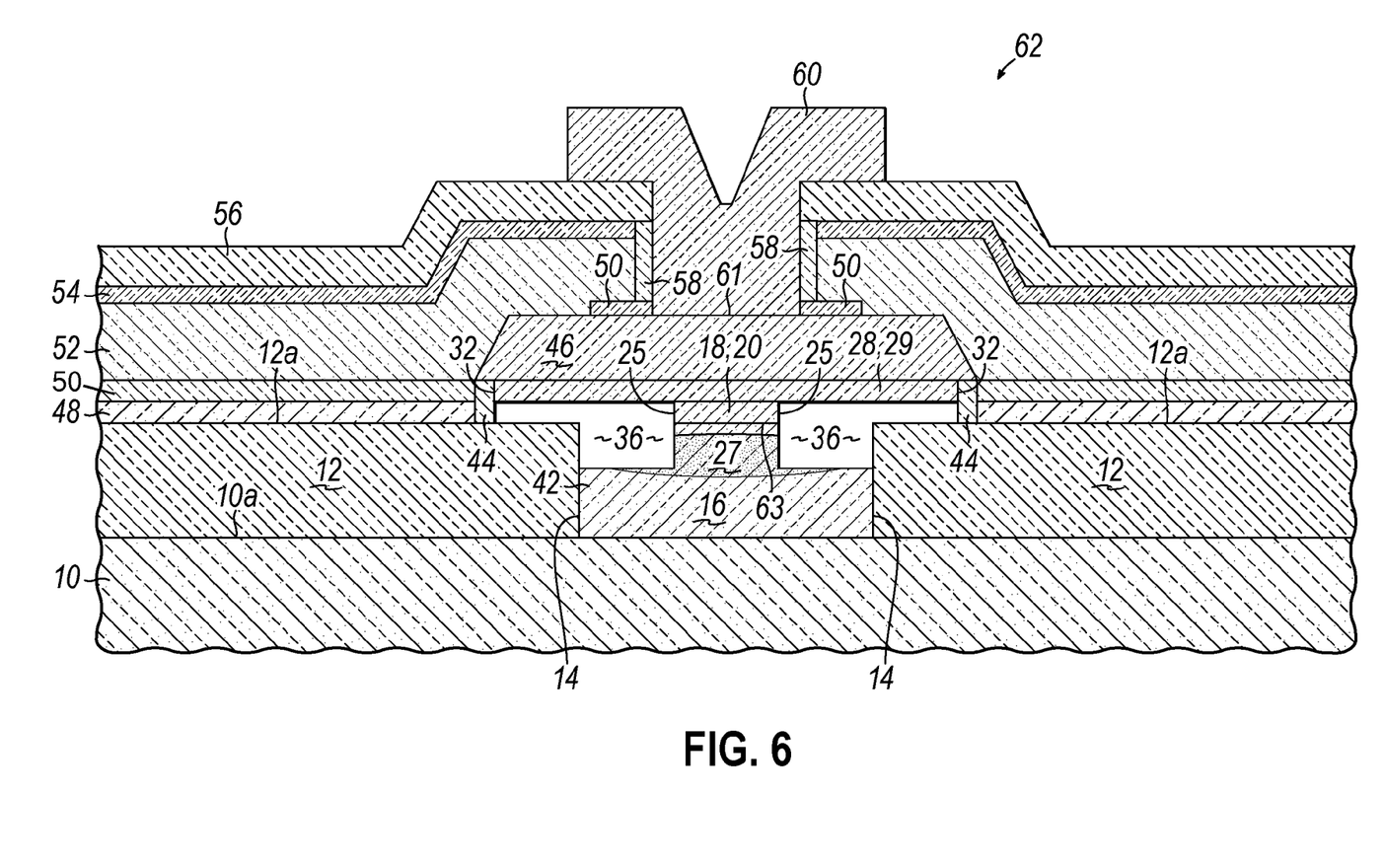

With reference to FIG. 6 in which like reference numerals refer to like features in FIG. 5 and at a subsequent fabrication stage of the processing method, spacers 44 are formed at a periphery of the section 29 of semiconductor layer 28 and have dimensions (e.g., height and thickness) configured to occlude or close an entrance to the airgaps 36, 37. The spacers 44 may be formed by depositing a conformal layer comprised of an electrical insulator, such as silicon nitride ($Si_3N_4$) deposited by chemical vapor deposition, and shaping the conformal layer with an etching process, such as reactive ion etching, that preferentially removes the electrical insulator from horizontal surfaces.

A base layer 46, which is comprised of a material suitable for forming an intrinsic base of a heterojunction bipolar transistor, is formed as an additive layer on the section 29 of semiconductor layer 28. The base layer 46 is comprised of a single crystal semiconductor material that is positioned in vertical alignment with the section 29 of semiconductor layer 28. The base layer 46 is coupled by the section 20 of semiconductor layer 18 and the section 29 of semiconductor layer 28 with the collector region 27. The width of the base layer 46 is approximately equal to the width of the section 29 of semiconductor layer 28. Facets of the base layer 46 are laterally displaced to a position in space outside of the area of the active device region in the completed device structure.

The base layer 46 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base layer 46 may be uniform or the germanium content of base layer 46 may be graded and/or stepped across the thickness of base layer 46. If the germanium content is stepped, a thickness of the base layer 46, such as a thickness directly contacting semiconductor layer 28, may not contain any germanium and may be entirely comprised of silicon (Si). The base layer 46 may be doped with one or more species, such as boron either with or without carbon.

Base layer 46 may be formed using a low temperature epitaxial (LTE) growth process, such as vapor phase epitaxy (VPE) that may be conducted at a growth temperature ranging from 400° C. to 850° C. Single crystal semiconductor material (e.g., single crystal silicon and/or single crystal SiGe) epitaxially grows on the section 29 of semiconductor layer 28. The crystal structure of single crystal material of the semiconductor layer 28 serves as a crystalline template for the growth of the crystal structure of the base layer 46. The spacers 44 occlude the entrance(s) to the airgap 36 so that the semiconductor material does not infiltrate into the airgap 36 during the epitaxial growth process.

A field region 48 consisting of the semiconductor material used to form the base layer 46 deposits on the top surface 12a of the trench isolation regions 12. In an embodiment, the field region 48 of deposited semiconductor material may cooperate with the spacers 44 to occlude the entrance to the airgaps 36, 37 in the completed device construction. The base layer 46 and field region 48 are discontinuous and are disposed in different planes. In particular, the base layer 46 is raised or elevated relative to the field region 48.

A dielectric layer 50 is applied and patterned to leave a pad at the intended location for an emitter and an opening to the base layer 46. An extrinsic base layer 52 is formed that is coupled through the opening in the dielectric layer 50 with the base layer 46. In one embodiment, the extrinsic base layer 52 may be comprised of polycrystalline semiconductor material (e.g., polysilicon or polycrystalline SiGe deposited by CVD process. If the extrinsic base layer 52 is comprised of SiGe, the concentration of Ge may have a graded or an abrupt profile and may include additional layers, such as a Si cap layer and/or a Si bottom layer. The extrinsic base layer 52 may be in situ doped with a concentration of a dopant, such as a dopant comprising an element selected from Group III of the Periodic Table (e.g., boron) that is effective to impart p-type conductivity and that may be optionally doped with carbon. As a consequence of the single crystal state of the base layer 46, the extrinsic base layer 52 may be comprised of single crystal semiconductor material that relies on the semiconductor material of the base layer 46 as a growth seed.

Dielectric layers 54, 56 may then be formed on the extrinsic base layer 52. Dielectric layer 54 may be comprised of an electrical insulator such as silicon nitride deposited using chemical vapor deposition. Dielectric layer 56 may be comprised of a different electrical insulator such as silicon dioxide deposited using chemical vapor deposition. Dielectric layers 54, 56 are patterned using photolithography and etching processes to define an emitter opening that is aligned with the collector region 27. The opening is extended by a controlled etching process, such as reactive ion etching, through the thickness of the extrinsic base layer 52 using the patterned dielectric layers 54, 56 as a hardmask. Non-conductive spacers 58 are formed inside the emitter opening and extend vertically to the dielectric layer 50. The spacers 58 may be formed by depositing a conformal layer comprised of an electrical insulator, such as silicon nitride deposited by chemical vapor deposition, and shaping the conformal layer with an anisotropic etching process, such as reactive ion etching, that preferentially removes the electrical insulator from horizontal surfaces.

An emitter 60 is formed in the spacer-lined emitter opening after the emitter opening is extended through the pad defined by dielectric layer 50. The emitter 60 is electrically and physically coupled with the base layer 46. The emitter 60 has a width aligned in the same direction as the widths W2, W3 and a length L (FIG. 1) transverse to the width. The non-conductive spacers 58 encircle or surround the emitter 60 so that the emitter 60 is electrically isolated from the extrinsic base layer 52. A base of the emitter 60 directly contacts the top surface of base layer 46 along a junction 61.

The emitter 60 may be formed from a layer of a heavily-doped semiconductor material that is deposited and then patterned using photolithography and etching processes. For example, the emitter 60 may be comprised of polysilicon or polycrystalline silicon-germanium deposited by CVD or LPCVD and heavily doped with a concentration of an n-type dopant effective to impart n-type conductivity. The extrinsic base layer 52 and dielectric layers 54, 56 may be lithographically patterned using an etch mask and etching processes, such as reactive ion etching, with suitable etch chemistries.

A heterojunction bipolar transistor is the resultant device structure 62 following the completion of the processing method. The device structure 62 has a vertical architecture in which the base layer 46 is located between the collector region 27 and the emitter 60, and in which the collector region 27, the base layer 46, and the emitter 60 are vertically arranged. The conductivity type of the semiconductor materials constituting the emitter 60 and the collector region 27 are opposite to the semiconductor material constituting the base layer 46. The extrinsic base layer 52 is coupled with the base layer 46 and is located peripheral to the emitter 60. Another junction 63 is defined at the interface between the collector region 27 and the section 29 of the semiconductor layer 28. The device structure 62 occupies a device region, which can be divided into an intrinsic device region coinciding with the portions of the emitter 60, base layer 46, and collector region 27 participating in the junctions 61, 63, and an extrinsic device region outside of the intrinsic device region.

Standard silicidation and standard middle-end-of-line (MEOL) and back-end-of-line (BEOL) processing follows, which includes formation of contacts and wiring for the local interconnect structure overlying the device structure 62, and formation of dielectric layers, via plugs, and wiring for an interconnect structure coupled by the interconnect wiring with the device structure 62, as well as other similar contacts for additional device structures like device structure 62 and CMOS transistors included in other circuitry fabricated on the substrate 10. Other active and passive circuit elements, such as diodes, resistors, capacitors, varactors, and inductors, may be integrated into the interconnect structure and available for use in the BiCMOS integrated circuit.

Figure 7:
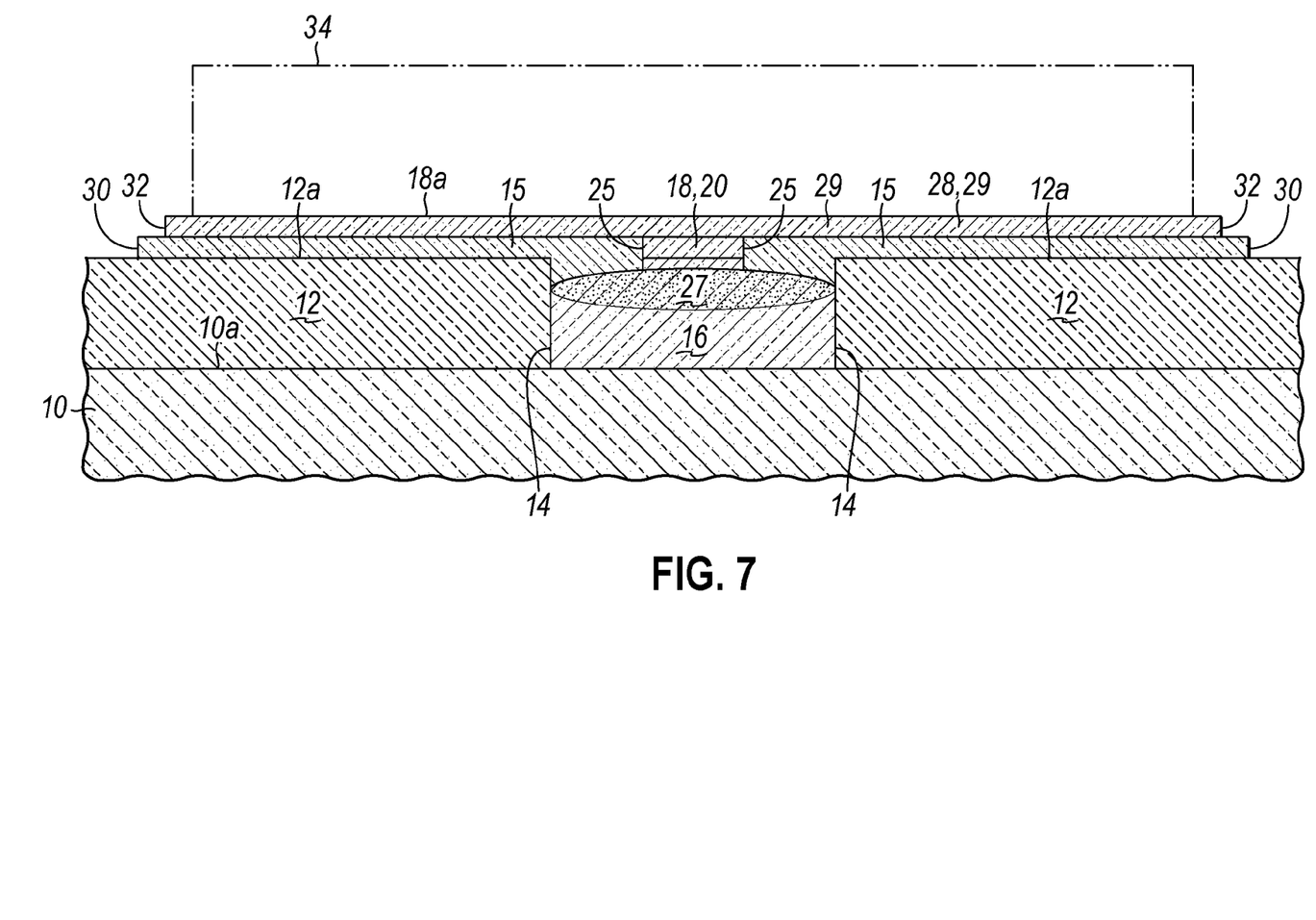
FIGS. 7 and 8 are cross-sectional views of a substrate portion at successive fabrication stages of a processing method for fabricating a device structure in accordance with an alternative embodiment of the invention.

With reference to FIG. 7 in which like reference numerals refer to like features in FIG. 3 and in accordance with an alternative embodiment, the conditions (e.g., time and temperature) for the thermal anneal are selected to control the recrystallization and the extent of the lateral regrowth of the semiconductor layers 18, 28 such that the edges 30, 32 are adjusted to extend further laterally over the trench isolation regions 12 relative to the sidewalls 14 of the trench isolation regions 12. The dimensions of the mask 34 are likewise enlarged to complement the increase in size of the single crystal section 15 of semiconductor layer 18 and the single crystal section 29 of semiconductor layer 28.

Figure 8:
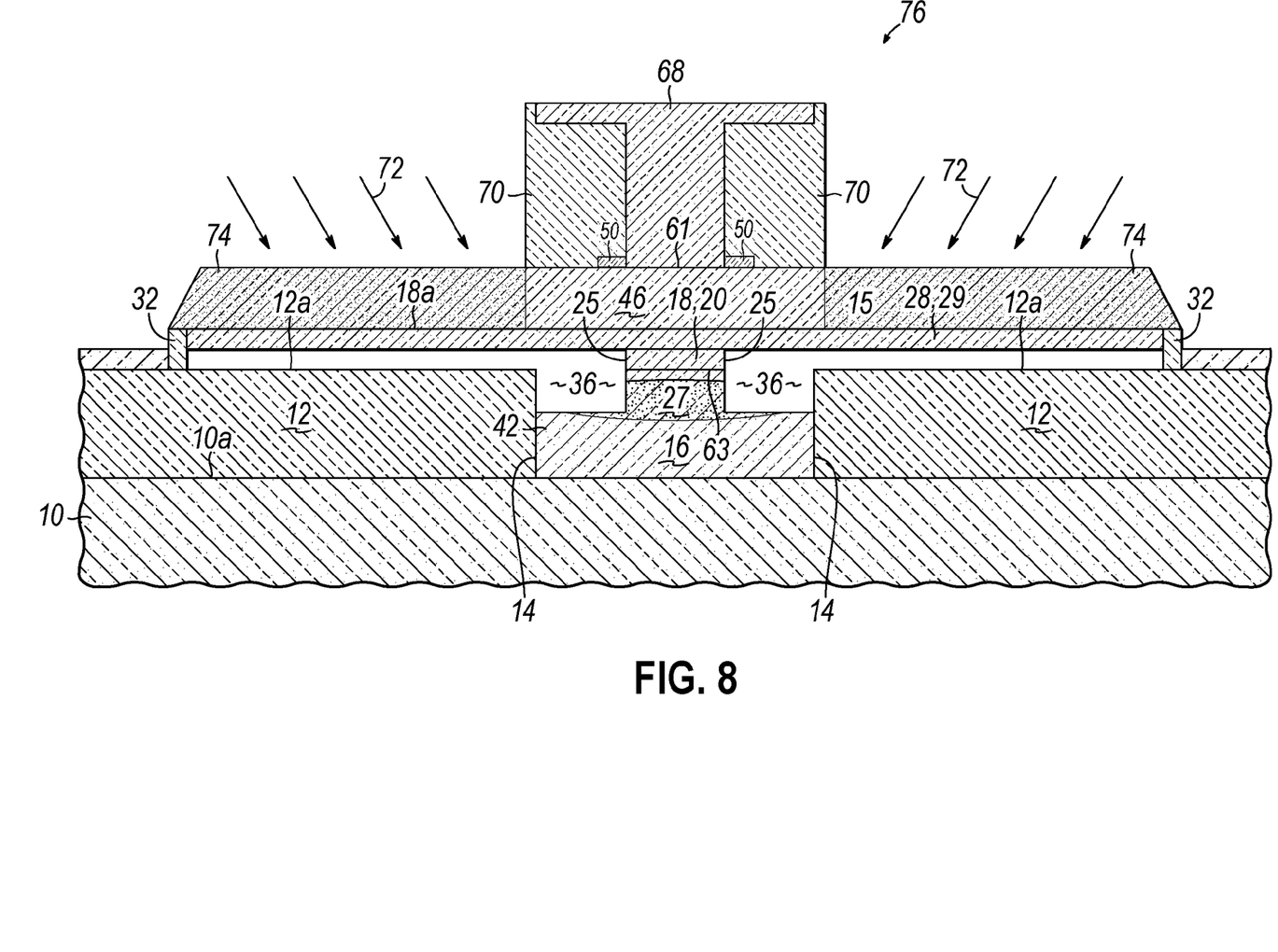
Figure 8A:
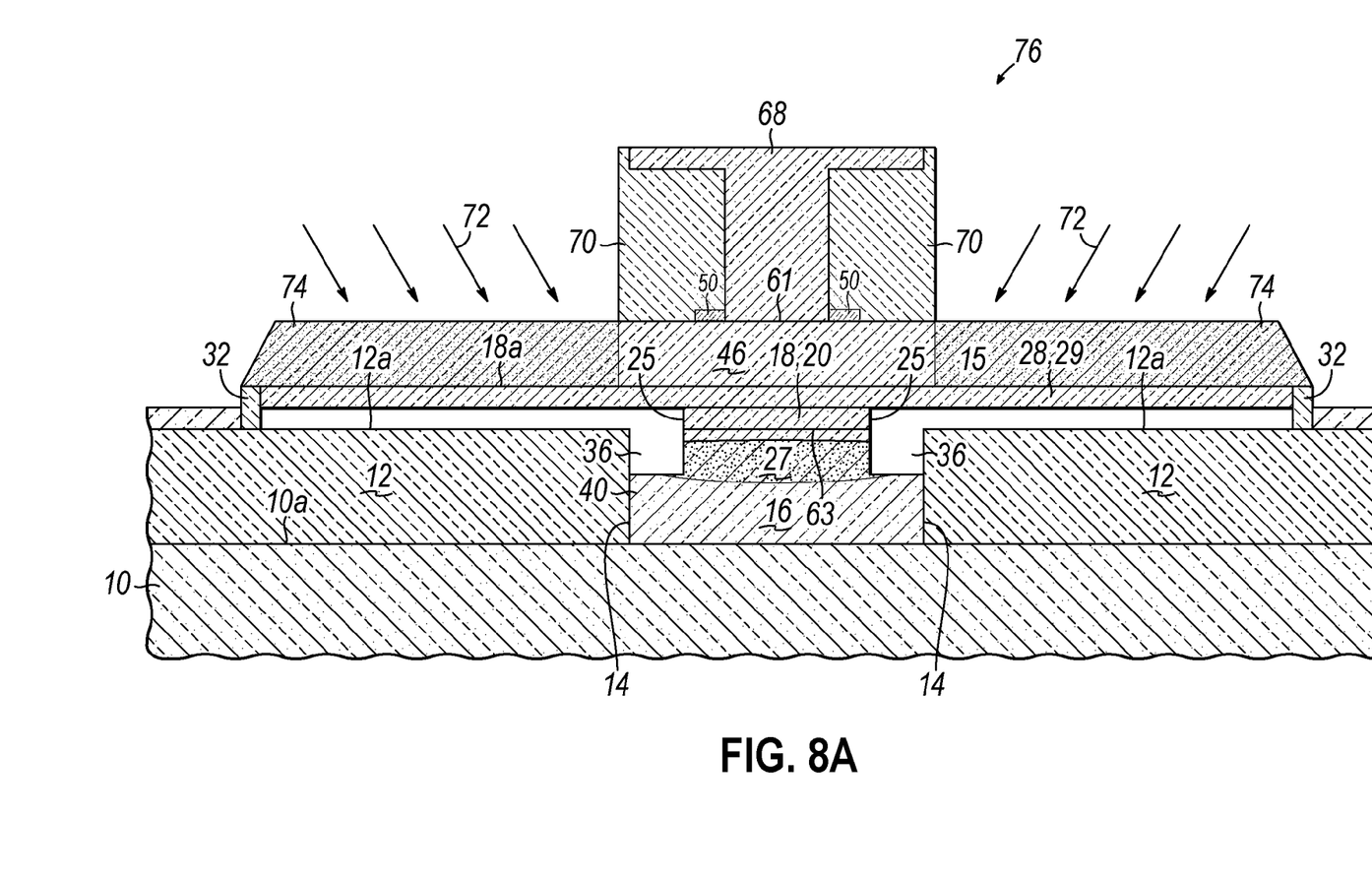
FIG. 8A is a cross-sectional view of the device structure of FIG. 8 taken at a different location along the length of the subsequently-formed emitter.

With reference to FIGS. 8, 8A in which like reference numerals refer to like features in FIG. 7 and at a subsequent fabrication stage of the processing method, an emitter 68 is formed that is coupled with the base layer 46. Non-conductive spacers 70 are present on the sidewalls of the emitter 68. The spacers 70 may be a composite structure formed from layers 52, 54, 56 that are shown in FIG. 6.

Energetic ions, as indicated diagrammatically by the single-headed arrows 72, are introduced using ion implantation into the sections 22 of semiconductor layer 18 that are not masked by the emitter 68 and spacers 70 to define an extrinsic base 74. The emitter 68 and spacers 70 operate as an ion-implantation mask that protects the underlying material of the base layer 46 from receiving an implanted dose of the ions 72. The implantation conditions (e.g., ion energy and dose) are selected to form the extrinsic base 74 with a desired depth profile and doping concentration inside the base layer 46. In an embodiment, the base layer 46 may be ion implanted to introduce a concentration of a p-type dopant from Group III of the Periodic Table (e.g., boron) in a concentration that is effective to impart p-type conductivity and to reduce the sheet resistance of the extrinsic base 74. In the representative embodiment, an angled implantation of ions 72 is performed. The resulting device structure 76 forming the heterojunction bipolar transistor lacks a raised extrinsic base as present in device structure 62. Standard silicidation and standard middle-end-of-line and back-end-of-line processing follows.

The shape and size of the active device region 16 and the collector region 27 formed in the active device region 16 is defined at least in part by the airgap 36. Similar to device structure 62, the active device region 16 and the collector region 27 formed in the active device region 16 have wide pedestal sections 40 (FIG. 8A) and narrow pedestal sections 42 (FIG. 8) that are narrow in comparison with the wide pedestal sections 40. The presence of the airgaps 36, 37 may be effective to reduce or eliminate out-diffusion of dopant from the implanted extrinsic base 74 into the base layer 46 and collector region 27 due to the elimination of a solid diffusion path and thereby provide a reduced collector-base capacitance.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a device structure, the method comprising:
    forming a trench isolation region that bounds an active device region;
    forming a first semiconductor layer on the active device region and on the trench isolation region;
    forming a first airgap vertically between the first semiconductor layer and a portion of the active device region; and
    forming a second airgap vertically between the first semiconductor layer and the trench isolation region,
    wherein the first airgap extends vertically into the active device region such that a first height of the first airgap between the first semiconductor layer and the portion of the active device region is greater than a second height of the second airgap between the first semiconductor layer and the trench isolation region.

2. The method of claim 1 wherein the active device region includes a first section and a second section laterally between the first section and the trench isolation region, and comprising:
    implanting the second section of the active device region to introduce an element effective to provide a first etch rate for the second section of the active device region that is greater than a second etch rate of the first section of the active device region.

3. The method of claim 2 wherein forming the first airgap vertically between the first semiconductor layer and the active device region comprises:
    after the second section of the active device region is implanted, removing the second section of the active device region with a selective etching process.

4. The method of claim 3 wherein the second section of the active device region includes implantation damage after being implanted, and further comprising:
    before the second section of the active device region is removed, regrowing the second section of the active device region.

5. The method of claim 3 wherein the active device region has a first width, and comprising:
    masking the first section of the active device region with a first section of a mask having a first width.

6. The method of claim 5 comprising:
    masking the first section of the active device region with a second section of the mask having a second width that is less than the first width,
    wherein, after the second section is removed, the first air gap includes a first width related to the first width of the first section of the mask and a second width related to the second width of the first section of the mask.

7. The method of claim 2 wherein the second section of the active device region is implanted with an angled ion implantation process.

8. The method of claim 2 further comprising
    before the first semiconductor layer is formed, forming a second semiconductor layer on the active device region and on the trench isolation region,
    wherein the second semiconductor layer is partially removed to form a portion of the first air gap and to form the second airgap.

9. The method of claim 8 wherein the element is further introduced into a section of the second semiconductor layer when the second section of the active device region is implanted, and forming the first airgap vertically between the first semiconductor layer and the active device region comprises:
    after the second section of the active device region and the section of the second semiconductor layer are implanted, removing the second section of the active device region and the section of the second semiconductor layer with a selective etching process.

10. The method of claim 9 wherein the second section of the active device region includes implantation damage after being implanted and the second semiconductor layer is comprised of a polycrystalline or amorphous semiconductor material, and further comprising:
    before the second section of the active device region and the section of the second semiconductor layer are removed, regrowing the active device region and the section of the second semiconductor layer.

11. The method of claim 9 wherein forming the first airgap vertically between the first semiconductor layer and the active device region comprises:
    removing the second section of the active device region and the section of the second semiconductor layer with an etching process to form the first airgap.

12. A device structure for a heterojunction bipolar transistor, the device structure formed using a semiconductor substrate, the device structure comprising:
    a trench isolation region in the semiconductor substrate;
    an active device region bounded by the trench isolation region, the active device region comprised of a portion of the semiconductor substrate;
    a first semiconductor layer overlying the active device region and on the trench isolation region;
    a first airgap vertically between the first semiconductor layer and a portion of the active device region, the first airgap having a first height between the first semiconductor layer and the portion of the active device region; and
    a second airgap vertically between the first semiconductor layer and the trench isolation region, the second airgap having a second height between the first semiconductor layer and the trench isolation region, wherein the first airgap extends vertically into the active device region such that a first height of the first airgap between the first semiconductor layer and the portion of the active device region is greater than a second height of the second airgap between the first semiconductor layer and the trench isolation region.

13. The device structure of claim 12 comprising:
a collector region in the active device region.

14. The device structure of claim 13 wherein the collector region includes a first section with a first width, and the first airgap includes a first section of a first width laterally between the first section of the collector region and the trench isolation region.

15. The device structure of claim 14 wherein the collector region including a second section with a second width less than the first width, and the first airgap includes a second section of a second width laterally between the first section of the collector region and the trench isolation region, and further comprising:
an emitter aligned with the active device region, the emitter having a length, and the first width and the second width of the first air gap are located along the length of the emitter.

16. The device structure of claim 12 wherein the trench isolation region has a sidewall, and the first airgap is located laterally between the collector region and the sidewall of the trench isolation region.

17. The device structure of claim 12 wherein the first airgap is coextensive with the active device region and the first semiconductor layer, and the second airgap is coextensive with the trench isolation region and the first semiconductor layer.

18. The device structure of claim 12 wherein the first airgap is contiguous with the second airgap.

19. The device structure of claim 12 further comprising:
a base layer on the first semiconductor layer; and
a second semiconductor layer between the first semiconductor layer and the active device region,
wherein the first semiconductor layer is undercut by the first airgap and the second airgap.

20. The device structure of claim 19 wherein the first airgap is coextensive with the active device region, the first semiconductor layer, and the second semiconductor layer.

* * * * *